United States Patent [19]

Inukai et al.

[11] Patent Number: 4,781,941
[45] Date of Patent: Nov. 1, 1988

[54] METHOD OF MATTING PRE-SENSITIZED PLATES

[75] Inventors: Yuzo Inukai; Tsuneyasu Matsuhisa, both of Shizuoka, Japan

[73] Assignee: Fuji Photo Film Co., Ltd., Kanagawa, Japan

[21] Appl. No.: 718,415

[22] Filed: Apr. 3, 1985

Related U.S. Application Data

[63] Continuation of Ser. No. 465,387, Feb. 10, 1983, abandoned.

[30] Foreign Application Priority Data

Feb. 10, 1982 [JP] Japan .................................. 57-20050

[51] Int. Cl.⁴ .............................................. B05D 1/04
[52] U.S. Cl. .................................... 427/27; 427/121; 427/299; 427/336; 427/377; 427/385.5; 427/389.9; 427/391; 427/394; 427/395; 427/421; 427/426
[58] Field of Search ................. 427/27, 121, 299, 336, 427/377, 385.5, 389.9, 391, 394, 395, 421, 426

[56] References Cited

U.S. PATENT DOCUMENTS

| | | | |
|---|---|---|---|
| 3,198,170 | 8/1965 | Onishi | 118/627 |
| 3,265,524 | 8/1966 | Echeagaray | 428/913 |
| 3,377,165 | 4/1968 | Workman | 430/162 |
| 3,511,700 | 5/1970 | Miro | 428/206 |
| 3,861,952 | 1/1975 | Tokumoto et al. | 428/209 |
| 3,996,410 | 12/1976 | Gruetzman | 427/27 |
| 4,086,872 | 5/1978 | Pan | 427/27 |
| 4,168,979 | 9/1979 | Okishi et al. | 430/162 |
| 4,216,289 | 8/1980 | Oda et al. | 430/166 |
| 4,288,521 | 9/1981 | Kojima et al. | 430/162 |

Primary Examiner—Richard Bueker
Attorney, Agent, or Firm—Sughrue, Mion, Zinn, Macpeak & Seas

[57] ABSTRACT

A method of matting a pre-sensitized printing plate is disclosed. The method is comprised of electrostatically providing fine droplets of an aqueous liquid with a resin dissolved or dispersed therein on the obverse surface or reverse surface of the pre-sensitized printing plate and, thereafter, drying the fine droplets. The method is characterized in that before and/or after the attachment of the droplets the surface of the pre-sensitized printing plate is wet. The method can be continuously performed and provides a matted surface with protuberances firmly adhered to a substrate.

19 Claims, 1 Drawing Sheet

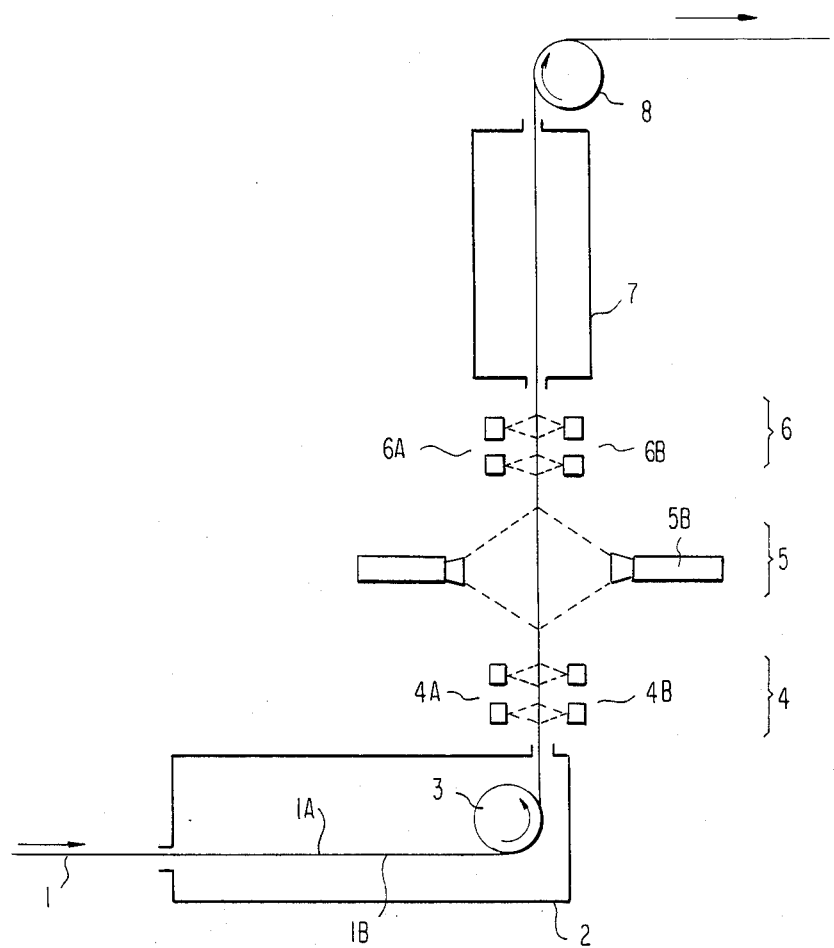

METHOD OF MATTING PRE-SENSITIZED PLATES

This is a continuation of application Ser. No. 465,387, filed Feb. 10, 1983 now abandoned.

FIELD OF THE INVENTION

The present invention relates to a method of matting the obverse side and/or the reverse side of pre-sensitized printing plates.

BACKGROUND OF THE INVENTION

A wide variety of techniques concerning the production of photo-sensitive materials have heretofore been developed. These techniques include a method of matting the obverse side or reverse side of photo-sensitive materials to prevent them from taking on an electrostatic charge, aid in eliminating adhesion between the materials and to improve their vacuum adhesion properties.

For example, in a photographic process comprising placing a film original on a photographic light-sensitive material and exposing the photo-sensitive material to light through the film original at the exposure step thereof to form the desired image or pattern in the photo-sensitive material, it is necessary to bring the film original into intimate contact with the surface of a photo-sensitive layer of the photo-sensitive material to eliminate blurring of the exposed image or pattern due to the clearance between them. For this reason, in general, a method utilizing a printing frame is employed. In such a method the photographic light-sensitive material and the film original are placed in a superposed relation between a glass plate and a rubber sheet of the printing frame. The clearance between the glass plate and the rubber sheet is then evacuated to bring the photographic light-sensitive material and the film original into intimate contact with each other. (This method is hereinafter referred to as a "vacuum adhesion method".) Japanese patent application (OPI) No. 111102/76 (corresponding to U.S. Pat. Nos. 4,216,289 and 4,288,326; the term "OPI" as used herein refers to a "published unexamined Japanese patent application") discloses a method of matting a photo-sensitive layer by providing therein a fine pattern consisting of coated areas and uncoated areas, greatly shortening the time required for vacuum adhesion. Matting methods of this type, i.e., methods of forming such fine patterns in a photographic light-sensitive material, are described in, for example, Japanese patent application (OPI) Nos. 96604/76, 98505/76 and 12974/80 (corresponding to U.S. Pat. No. 4,216,289 and 4,288,526, and British Pat. No. 2,025,646A, respectively).

In recent years, among photographic light-sensitive materials, a photo-sensitive material of the type having both surfaces coated with the respective photo-sensitive layers, i.e., a so-called pre-sensitized printing plates which have photo-sensitive layers on both surfaces of the plates, have been increasingly used. In these photographic light-sensitive materials, however, various problems are encountered in providing a fine pattern on the surfaces of the two photo-sensitive layers by a gravure coating method as described in U.S. Pat. No. 4,216,289. For example, it is necessary that a fine pattern is first coated on one surface and dried, and then another fine pattern is coated on the other surface and dried. This method requires the use of relatively large sized equipment. Furthermore, coated areas of the fine pattern provided on the reverse side by the above-described method are sometimes peeled apart or collapsed because they are often rubbed by a conveyer roller before the photo-sensitive material is cut in the desired size. This gives rise to the problem that the vacuum adhesion time required when the photo-sensitive layer on the reverse side is exposed imagewise is seriously increased compared with the time required for imagewise exposing the photo-sensitive layer on the obverse side. Another problem is that in bringing the photo-sensitive layer on the obverse side into intimate contact with a film original by vacuum adhesion and exposing them to light the coated areas of the fine pattern on the reverse side are pressed and collapsed by a printer. This increases the vacuum adhesion time required for exposing the photo-sensitive layer on the reverse side.

In order to overcome the problem of contamination of a film original by a coating layer which is provided to improve vacuum adhesion properties, U.S. Pat. No. 4,288,526 discloses a method of coating a dispersion of a wax-like or fine powdery resin having releasing properties in a low boiling organic solvent by means of an air spray coater. This coating layer easily separates, and also produces problems as described above, because its adhesion force to the surface of a photo-sensitive printing plate is poor. Further, from a viewpoint of safety, it is not desirable to use such organic solvents.

British Pat. No. 2,025,646A discloses a method in which a solid powder is sprayed on a photo-sensitive printing plate and firmly fixed thereto by heating. In the case of a pre-sensitized printing plate, having both surfaces with the respective photo-sensitive layers, the matted layer on one side is collapsed when the photo-sensitive printing plate is conveyed by means of rollers until the sprayed solid powder is cooled after it is heat-adhered. It is, however, difficult from a viewpoint of handling to convey the photo-sensitive printing plate without the use of rollers. Further, in order to produce such powders it is necessary for the resins to be pulverized and classified. This increases production costs.

U.S. Pat. No. 4,288,521 discloses a method of uniformly spraying and adhering a solid powder on the surface of a continuously running photo-sensitive printing plate. This method requires the use of a pressurized air-supply unit, a powder-supply unit, an ejector, a distributor, a cyclon, and so forth. Thus, the equipment for use in this method is very complicated and large. Furthermore, in the case of pre-sensitized printing plates which have photo-sensitive layers on both surfaces of the plate, when the pre-sensitized printing plate is conveyed after simultaneous attachment of solid powder, the solid powder easily separates from the pre-sensitized printing plate.

Photographic light-sensitive materials are matted not only to improve vacuum adhesion properties, but also to prevent electrostatic charging, and sticking and bonding between the photographic light-sensitive materials, although the above explanation has been made by reference to the improvement of vacuum adhesion properties. Application of matting is not limited to the surface of a photo-sensitive layer. The reverse side surface may also be matted. Also, in performing the matting procedure for the purpose of preventing electrostatic charging, or sticking and bonding between photographic light-sensitive materials, the same problems as encountered in improving the vacuum adhesion properties arise.

The present invention is intended to overcome the above-described problems by utilizing an improved electrostatic spray-coating technique for matting.

As is well known, various electrostatic spray-coating processes have been developed, including a disc type coating head, a bell type coating head, and a gun type coating head. In accordance with any of the above-described processes, when an aqueous solution as described hereinafter is electrostatically sprayed and provided on the surface of a photo-sensitive material, if the charged droplets of the aqueous solution have a very small diameter, their adhesion force is poor since the contact area between the surface of the photo-sensitive material and the droplet is small. Therefore, when, after the removal of water in the fine droplets attached, the photo-sensitive material is conveyed while holding it in contact with, for example, rolls, attached fine droplets will separate from the photo-sensitive material as for the cases of the above-described methods, and the desired vacuum adhesion time cannot be attained. Further, the case of photographic light-sensitive material, when the photographic light-sensitive material is brought into intimate contact with a film original, the above-separated droplets or particles deposit on the film original, decreasing its function and dot depth. In particular, in the case of a pre-sensitized printing plates which have photo-sensitive layers on both surfaces of the plate, attached particles on the reverse side surface which are to be exposed later are pressed and collapsed by a printer when the obverse side is brought into contact with the film original by vacuum adhesion and exposed imagewise. This increases the time required for vacuum adhesion for the exposure of the reverse side.

SUMMARY OF THE INVENTION

An object of the invention is to provide a method of mating a pre-sensitized printing plate by electrostatically providing fine droplets of an aqueous solution with a resin dissolved or dispersed therein on the obverse surface or the reverse surface of the pre-sensitized printing plate, which allows small protuberances which are formed on the pre-sensitized printing plate to firmly attach to the pre-sensitized printing plate so that they do not separate therefrom during the handling thereof.

Another object of the invention is to provide a method of matting a pre-sensitized printing plate in which the height of protuberances can be controlled.

A further object of the invention is also to provide a method of matting a pre-sensitized printing plate which makes it possible to easily control the adhesion force of particles which form the protuberances to the recording material.

The present invention relates to a method of matting a pre-sensitized printing plate by electrostatically attaching fine droplets of an aqueous liquid with a resin dissolved or dispersed therein on the obverse surface and/or the reverse surface of the pre-sensitized printing plate, and drying the thus-attached fine droplets, characterized in that before and/or after the attachment of the fine droplets, the surface of the pre-sensitized printing plate is wet.

BRIEF DESCRIPTION OF THE DRAWING

The FIGURE is a schematic illustration of a method of matting a web of a pre-sensitized plate, including an embodiment of the invention.

DETAILED DESCRIPTION OF THE INVENTION

The present invention will hereinafter be explained in detail.

Recording materials as used herein basically comprises a support and a photo-sensitive printing layer on the support. Typical photo-sensitive layers include a photographic light-sensitive layer and a magnetic recording layer. For example, photo-sensitive materials carrying a photographic light-sensitive layer means a photographic light-sensitive material for use in the preparation of a printing plate. In addition, among a number of such sensitive materials, a laser photo-sensitive material which is sensitive to laser beams, and so forth can be listed. Although the method of the invention is specified so that it is applied only to photo-sensitive materials as described above, since the fundamental technical concept of the invention resides in providing a fine mat as described in the appended claims, as a matter of course, the type of the photo-sensitive material is not critical in the invention. In other words, although the method of the invention can be applied to any kinds of materials, the invention is limited so that the method is applicable to pre-sensitized printing plate, for the sake of clarification of the invention, since pre-sensitized printing plate can make the most effective use of the invention.

Supports for use in the preparation of pre-sensitized printing plates as used herein are those having dimensionally stable surfaces. In connection with the shape of the support, in the preparation of light-sensitive materials, it is preferably sheet-like or plate-like in view of ease of handling. The optimum shape is selected optionally taking into consideration the purpose for which the ultimate photo-sensitive material is used, or the apparatus in which it is used. These supports are made of materials such as paper; paper coated with thermoplastic resins, e.g., polyethylene, polypropylene, and polystyrene; metallic plates, e.g., aluminum, various aluminum alloys, zinc, iron, and copper; films made of plastics, e.g., cellulose diacetate, cellulose butyrate, cellulose acetate butyrate, cellulose propionate, cellulose triacetate, cellulose nitrate, polyethylene terephthalate, polypropylene, polycarbonate, and polyvinyl acetal; and paper or plastic films on which the above-described metals are laminated or covered by vacuum deposition. The material of the support is also selected taking into consideration the purpose for which the ultimate pre-sensitized printing plate is used.

In connection with the photo-sensitive layer of the photo-sensitive material, as photo-sensitive layers for photographic light-sensitive materials, for example, a silver halide-gelatin emulsion photo-sensitive material, a diazo resin photo-sensitive layer, a photo-sensitive resin photo-sensitive layer, and other may photo-sensitive layers are known. They can be used as the photo-sensitive layer of the photographic light-sensitive material as used herein. The same is the case with laser sensitive materials and materials. With regard to the other items of photo-sensitive materials, e.g., structure, material, method of production, working, photo-sensitive process, and use, known techniques can be utilized, and it is believed that no further detailed explanation is needed.

The present invention is directed to a method of matting the obverse surface and/or the reverse surface of a photo-sensitive material as described above. For this purpose, fine droplets of an aqueous liquid with a resin dissolved or dispersed therein are electrostatically deposited on the desired side and dried. The aqueous liquids used are capable of attaching to the obverse side or reverse side of the photo-sensitive material preferably in the condition that it is uniformly dispersed electrostatically. The aqueous liquid has a viscosity of 1.5 to 500 centipoise, preferably 2 to 100 centipoise. In the case of photographic light-sensitive materials, laser sensitive materials, and so forth, resins which can be used in the preparation of such aqueous liquids cited, for example, in the British Pat. No. 2,081,919A, include copolymers of acrylic acid esters and acrylic acid or methacrylic acid, terpolymers of styrene, acrylic acid esters, and acrylic acid or methacrylic acid, copolymers of acrylic acid esters, styrene, acrylonitrile, and acrylic acid or methacrylic acid or, maleic acid or, itaconic acid, etc., and vinyl-based polymers, such as polyvinyl alcohol, polyvinyl acetate, and polyvinyl pyrrolidone. The copolymers have a molecular weight of 5,000 to 50,000, preferably 10,000 to 30,000. Monomers are not substantially present within the copolymer. From these resins, a suitable one is selected, and in accordance with a conventionally known method, it is dissolved or dispersed in water to prepare the desired aqueous liquid. The water may contain low boiling organic solvents not dissolving photo-sensitive layer components. Low boiling organic solvents are solvents having a boiling point of 100° C. or less under one atmosphere. The solvents used in connection with the present invention are water-soluble solvents. The solvents function by assisting the resin in dissolving or dispersing. Other water-soluble materials which are known to be useful include sodium styrenesulfonate, acrylamide, colloidal silica (as a powder of an inorganic material) and phenol resin (as a powder of a polymer). Further, it may contain other water-soluble substances, and fillers such as inorganic substance powder and polymer powder, which exert no adverse influences on the light-sensitive layer and fine droplets attached thereto. These aqueous liquids can be prepared, for example, by emulsifying starting materials in water in the presence of surface active agents and then emulsion-polymerizing them by the use of polymerization initiators such as potassium persulfate as is the case with the usual method of synthesizing latexes. In this case, the product is obtained as an aqueous dispersion. Alternatively, part of acrylic acid, methacrylic acid, maleic acid, itaconic acid or the like is converted into its sodium, potassium or ammonium salt to obtain the product as an aqueous solution of the resulting copolymer.

Different resins are utilized depending upon the particular requirements of the surface of the material on which the small protuberances are formed. For example, different resins are utilized depending upon the vacuum adhesion properties or adhesion prevention properties desired. The resin utilized on the two surfaces of the pre-sensitized printing plate may be different resins depending upon the particular properties required of that surface. The concentration of the resin in the aqueous liquid is within the range of 5 to 50% by weight, preferably 5 to 30% by weight. When both surfaces are matted (small protuberances appearing on both surfaces of the photo-sensitive medium), it is not necessary to change the concentration. However, when only one surface of the photo-sensitive medium is matted, the concentration can be changed depending upon the surface of the matting desired.

The thus-prepared aqueous liquid is changed into fine droplets by a method or apparatus where they are electrostatically attached. Examples of such method include an electrostatic air spray method, an electrostatic airless spray method, a rotary spray type electrostatic coating method, an electrostatic coating method as described in Japanese patent publication No. 28740/80. Apparatuses used in connection with these methods are known. In any method or apparatus, basically, fine aqueous liquid droplets are formed and, at the same time, electrostatically charged, and then electrostatically attached by utilizing the electric field between the electrode and the surface on which the droplets are deposited.

One of the methods which are suitable for the practice of the invention is a rotary spray type electrostatic coating method. This method is explained in detail in many literatures, and has been improved in many respects. When this type of apparatus is used, the aqueous liquid is continuously introduced at 5 to 1,000 ml/min. into the inner periphery at the back of the cup-like spraying head which rotates at a rate of from 10,000 to 50,000 rpm. The aqueous liquid in the spraying head is converted into a thin film form on the inner peripheral surface thereof by the utilization of centrifugal force due to rotation. This aqueous liquid in the thin film form is allowed to flow on the cup-like surface and is sprayed from the top of the spraying head by the action of centrifugal force and also, by the electrostatic action of the top portion on which a voltage of from $-50$ to $-120$ kv has been applied. These charged and sprayed aqueous liquid droplets are scattered and attached to the surface of the pre-sensitized printing plate by the affection of the high electric field formed between the rotary cup spraying head and the recording material.

The most significant feature of the invention is that the surface of the recording material onto which the above-described aqueous liquid droplets are electrostatically attached is wet before and/or after the electrostatic attachment of the aqueous liquid droplets. The description "wetting the surface of the recording material" as used herein includes, as well as a procedure to form a liquid film on the surface, a procedure in which the fine droplets attached on the surface are allowed to extend by decreasing the water contact angle of the surface at the wetting step as described hereinafter. That is, it means that the surface of the recording material is wet to the extent that the wetting of droplets to be attached is increased. For this purpose, a steam spray method, an ultrasonic moisture-increasing method, and so forth can be utilized. In accordance with any method, it is necessary to carefully watch the wetting procedure to see that it does not exert any adverse influences on the recording layer or fine deoplets attached on the surface of the recording layer; for example, so that it does not cause contamination of the surface of the photo-sensitive layer, does not break the attached fine droplets, and does not dissolve the attached fine droplets, inhibiting mat formation. The method of the invention increases the attached surface area of aqueous liquid droplets attached uniformly on the surface of the recording material, and allows the aqueous liquid droplets to firmly attach onto the surface of the recording material. The reason for this is believed to be that when the surface of the recording material is wet, a liquid film is formed on the surface, allowing the aqueous liquid droplets which have already attached thereonto or will attach thereonto, to extend on the surface of the recording material.

In the method of the invention, the surface temperature of the recording material, the running speed of the recording material, the time required until fine droplets are attached on the surface of the recording material after the liquid film is formed thereon, the time required until the liquid film is formed after the fine droplets are attached on the surface of the recording material, the time required until the recording material is dried after the fine droplets are attached on the surface or the fine droplets are attached and the liquid film is formed, and so forth exert influences on the state of the protuberance to be formed. For example, the height of the protuberance after drying can be controlled by controlling the thickness of the liquid film formed on the surface when the fine droplets are attached thereon. That is, by increasing the thickness of the liquid film; i.e., by increasing the extent of wetting, the height of the protuberance can be decreased, whereas by decreasing the thickness of the liquid film, i.e., decreasing the extent of wetting, the height of the protuberance can be increased. Therefore, in order to produce a protuberance providing the effect of vacuum adhesion, it is necessary to control the above-described conditions and the extent of wetting; i.e., to control the thickness of the liquid film on the surface of the pre-sensitized printing plate.

The effect of vacuum adhesion is greatly influenced by the height of the small protuberances (matting) formed on the obverse or reverse surface of the pre-sensitized printing plate. The factor which most effects the height of the protuberances is the degree of wetting. The factor having the next greatest influence on the height of the protuberances is the concentration of the resin in the aqueous liquid and the temperature of the obverse or reverse surface of the pre-sensitized printing plate. The height of the protuberances increases as the concentration of the resin increases and as the temperature increases. The thickness of the liquid layer formed on the obverse or reverse surface of the pre-sensitized printing plate by a wetting device is extremely thin and is assumed to be about several microns.

The pre-sensitized printing plate which has been subjected to the wetting treatment after and/or before the electrostatic attachment of the fine aqueous liquid droplets is then dried, whereby solids of the liquid droplets firmly adhere to the surface, thereby forming a matted surface. This drying and conditions under which the drying is performed can be determined by reference to the known techniques in this field. For example, hot air is blown onto the recording material, or the recording material is passed through a room maintained at a high temperature and a low humidity. The thus-dried particles which form the protuberances are present in a scattered form on the surface of the pre-sensitized printing plate. In the case of this invention, the number of the protuberances formed is from 1 to 1,000 per square millimeter and preferably from 5 to 500 per square millimeter. The height of each protuberance is preferably from 0.5 to 20 microns, and the diameter of each protuberance is preferably from 1 to 200 microns.

The present invention will hereinafter be explained by reference to the accompanying drawing.

The FIGURE is a schematic illustration of a sequence of steps including a step where the method of the invention is performed.

Referring to the FIGURE, there is schematically shown a sequence of steps including a step where the method of the invention is performed, wherein the reference numeral 1 indicates a pre-sensitized printing plate produced in a web-like form. The 1A indicates one surface of the pre-sensitized printing plate and 1B, the other surface of the pre-sensitized printing plate. The number 2 indicates a temperature-controlling room 3, indicates a pass roll, 4 indicates a wetting unit where the pre-sensitized printing plate 1 is to be wet before it is coated, 5 indicates an electrostatic coating unit, 6 indicates a wetting unit where the pre-sensitized printing plate 1 is to be wet after it is coated, 7 indicates a drying room, and 8 indicates a pass roll. The surface 1A is treated by the respective wetting unit 4A, electrostatic spray coating unit 5A, and wetting unit 6A. The surface 1B is treated by the respective wetting unit 4B, electrostatic spray coating unit 5B, and wetting unit 6B.

The pre-sensitized printing plate 1 comprising a web-like support and a photo-sensitive layer coated thereon is produced by a group of machines (not shown) and introduced into the equipment shown in the FIGURE. The pre-sensitized printing plate 1 enters the temperature-controlling room where its surface temperature is controlled and, thereafter, it is introduced into the electrostatic spray coating unit 5. Before and after the electrostatic spray coating unit 5 there are provided the respective wetting units 4 and 6. The surface of the pre-sensitized printing plate is preferably wet after adhering droplets of the aqueous liquid in which the resin has been dissolved or dispersed. If the wetting is carried out after adhering the droplets to the surface of the pre-sensitized printing plate the effect is very advantageous. Further, if the running speed of the web is high it is desirable to wet the surface of the pre-sensitized printing plate both before and after adhering the droplets thereon. Alternatively, it is possible to wet the surface by a means of increasing the wetting effect after adhering the droplets. When the pre-sensitized printing plate 1 is to be wet before electrostatic spray coating, it is wet with the wetting unit 4. When, on the other hand, the pre-sensitized printing plate 1 is to be wet after electrostatic coating, it is wet in the wetting unit 6. Further, when the pre-sensitized printing plate 1 is to be wet both before and after electrostatic spray coating, the wetting units 4 and 6 both operates. When the pre-sensitized printing plate 1 passes through the electrostatic spray coating unit 5, electrostatically charged fine droplets of an aqueous liquid with a resin dissolved or dispersed therein are scattered on the pre-sensitized printing plate by means of the unit 5. The pre-sensitized printing plate 1 with the fine droplets scattered thereon enters the drying room 7 where it is dried in the atmosphere of elevated temperature and low humidity, if desired, by blowing hot air, and the thus-dried pre-sensitized printing plate 1 is then withdrawn from the drying room 7 through the pass roll 8.

The FIGURE shows the production of a pre-sensitized printing plate with a photo-sensitive layer coated on both surfaces thereof. In this case, the wetting unit 4A and/or the wetting unit 6A, and the electrostatic spray coating unit 5A are operated for the surface 1A, and the wetting unit 4B and/or the wetting unit 6B, and the electrostatic spray coating unit 5B, for the surface 1B. Even in the production of a photo-sensitive material with a recording layer coated on one side thereof, the equipment of the FIGURE can be utilized in which case the units on one side are stopped.

Preferred process conditions in this embodiment are as follows:

The pre-sensitized printing plate 1 is introduced into the temperature-controlling room 2 where it is heated so that its surface temperature is from 10° to 65° C. and preferably from 25° to 45° C. Subsequently the pre-sensitized printing plate 1 is wet by spraying steam on the obverse surface or reverse surface thereof through a steam spray tube with a slit provided therein. The steam is expelled from a steaming tube. The inner pressure of the tube is above 1 atmosphere and the temperature of the steam after discharge is below 100° C. After wetting, the pre-sensitized printing plate 1 is introduced into the electrostatic spray coating unit 5 wherein the aqueous liquid is sprayed thereon. The time required until the fine droplets are scattered on the pre-sensitized printing plate after it is wet, or the time required until the pre-sensitized printing plate is wet after the fine droplets are scattered thereon is from 0.1 to 30 seconds, usually within the range of from 0.5 to 10 seconds. The aqueous liquid is sprayed under surrounding conditions of a temperature of from 15° to 60° C., preferably from 20° to 45° C., and a relative humidity of from 15 to 80%, preferably from 30 to 70%. The time required for the sprayed pre-sensitized printing plates to be conveyed to the drying room after the aqueous liquid-spraying step or after the subsequent wetting step is 20 seconds or shorter, usually from 0.5 to 7 seconds. The drying temperature is 30° C. to 100° C., preferably 40° to 80° C.

The invention is explained in detail by reference to the following examples.

EXAMPLE 1

Both surfaces of a 0.24 mm thick aluminum plate were sand-grained using a nylon brush and an aqueous dispersion of 400 mesh pumice stone and thoroughly washed with water. This aluminum plate was dipped in a 5% aqueous solution of sodium triphosphate maintained at 70° C. for 3 minutes, washed with water, and dried. A photo-sensitive solution as described in British Pat. No. 1,113,759 was prepared by dissolving 1 part by weight of a naphthoquinone-1,2-diazido-5-sulfonic acid ester of polyhydroxyphenyl obtained by polycondensation of acetone and pyrogallol and 2 parts by weight of a novolak type phenol-formaldehyde resin in a mixed solvent of 20 parts by weight of 2-methoxyethyl acetate and 20 parts by weight of methyl ethyl ketone. This photo-sensitive solution was coated on one surface of the above-prepared plate and then on the other surface to produce a pre-sensitized printing plate which has photo-sensitive layers on both surfaces of the plate. The thus-produced printing plate was cut in three 1,003 mm × 800 mm pieces to produce Samples A, B and C.

An aqueous solution (solids content: 10%) of a methyl methacrylate-ethyl acrylate-sodium acrylate (charged weight ratio: 68:20:12) was coated on each sample on both sides thereof by a rotary spray electrostatic coating method. Sample A was wet by applying steam on the surface to be coated with the coating solution about 2.5 seconds before its coating. Sample B was wet about 2.5 seconds after its coating by applying steam on the coated surface thereof. Sample C was a control sample and was not wet.

The fine droplets of the aqueous liquid were then dried. In the case of Samples A and C, the conveyance time from coating head to drying room was about 3 seconds, and in the case of Sample B, the conveyance time from wetting head to drying room was also about 3 seconds. Drying was performed by passing through the atmosphere at a temperature of 60° C. and a humidity of 10% for 5 seconds. In each sample, the amount of the fine droplets coated was 0.06 g/m$^2$, and they were distributed at a ratio of from 50 to 100 per square millimeter. The height of the protuberance formed after drying was from about 2 to 6 microns, and its diameter was from about 10 to 50 microns.

For each sample, measurements were taken with respect to staining of the conveying roll when the sample was contacted with the roll, the vacuum adhesion time when the sample was superposed on a film original (550 mm × 650 mm) and brought into intimate contact therewith by vacuum adhesion, and staining of the film original after the vacuum adhesion.

The results are shown in Table 1.

TABLE 1

| | Sample | | |
|---|---|---|---|
| | A | B | C |
| Wetting Step | Before coating | After coating | None |
| Stain of Conveying Roll | None | None | Stained* |
| Vacuum Adhesion Time | | | |
| Obverse Side | 23 sec | 26 sec | 18 sec |
| Reverse Side | 24 sec | 27 sec | 30 sec |
| Stain of Film Original | None | None | Stained* |

*About 3% of the surface area of the roll was stained per one revolution of roll.

It can be seen from Table 1 that Samples A and B of the present invention cause almost no staining of the conveying roll or film original, whereas with Sample C, the control sample, both the conveying roll and the film original are stained and the attachment of protuberances is very poor.

EXAMPLE 2

A pre-sensitized printing plate of the type that a photo-sensitive layer was coated only on one surface thereof was prepared in the same manner as in Example 1, and was subjected to the same testings as in Example 1. This material had the same vacuum adhesion properties as for the one as produced in Example 1, and caused no staining of the conveying roll or film original.

EXAMPLE 3

One surface of a pre-sensitized printing plate which has photo-sensitive layers on both surfaces of the plate as in Example 1 was coated with the same aqueous terpolymer solution as used in Example 1 in the same manner as in Example 1, wet with two ultrasonic spraying apparatuses (produced by Wet Master Co., Ltd.) and then dried at a temperature of 60° C. and a humidity of 10% for about 5 seconds. With the thus-dried resinous layer, the coating amount, number of attached protuberances, and height were the same as in Example 1. Other conditions under which the aqueous terpolymer solution was coated were the same as those conditions under which in Example 1 the wetting procedure was performed after the attachment of the fine droplets. The thus-produced plate was tested in the same manner as in Example 1. This plate has the same vacuum adhesion properties as the surface of Sample B of Example 1, and caused no staining of the conveying roll or film original.

In accordance with the method of the invention, as described above, fine aqueous liquid droplets are electrostatically attached on the obverse surface or reverse surface of a pre-sensitized printing plate and dried to form a protuberance pattern. The present invention produces various advantages; for example, increases the vacuum adhesion properties of various types of pre-sensitized printing plates, prevents sticking and blocking between the recording materials, prevents the recording materials to be charged, provides the pre-sensitized printing plates with good writing properties, increases the running properties of a recording tapes in a cassette, and prevents blocking between magnetic films. The method of the invention permits the uniform provision of fine protuberances on the pre-sensitized printing plates. Futhermore, the protuberances provided on the pre-sensitized printing plates firmly adhere thereto and do not easily separate therefrom.

Therefore, even in the case of photographic light-sensitive materials, their inherent photographic characteristics are not deteriorated and their dot reproduction is good.

Depending on the purpose for which the ultimate pre-sensitized printing plate is used, the height of the protuberance can be appropriately and optionally changed. In the practice of the matting procedure, it is possible to increase the running speed of the web. This increases the production efficiency and makes it possible to produce a large number of pre-sensitized printing plates having uniform quality with ease and at low cost.

Simultanious matting procedure on both surfaces of recording material and shifting the procedure from matting single surface to matting both surfaces or the reverse shifting can be swiftly and easily realized according to the present invention. Furthermore, since an aqueous liquid is used in the invention, there is no danger of fire and waste pollution unlike the process of production using an organic solvent. In this way, the method of the invention produces various effects. Thus, the invention provides a very useful technique in this field.

While the invention has been described in detail and with reference to specific embodiments thereof, it will be apparent to one skilled in the art that various changes and modifications can be made therein without departing from the spirit and scope thereof.

What is claimed is:

1. A method for matting a pre-sensitized printing plate, comprising the steps of:
   providing a pre-sensitized printing plate;
   electrostatically attaching fine droplets of an aqueous liquid with a resin dissolved or dispersed therein on the surface of the pre-sensitized printing plate;
   wet extending the fine droplets on the surface either by steaming or ultrasonic spraying; and
   drying the fine droplets on the surface in order to form a matted surface, wherein the matted surface comprises protuberances having a diameter of from about 1 to 200 microns.

2. A method for matting a pre-sensitized printing plate, comprising the steps of:
   providing a pre-sensitized printing plate;
   wetting the pre-sensitized printing plate either by steaming or ultrasonic spraying; and
   electrostatically attaching fine droplets of an aqueous liquid with a resin dissolved or dispersed therein on the surface in order to form a matted surface, wherein the matted surface comprises protuberances having a diameter of from about 1 to 200 microns, wherein after the fine droplets are electrostatically attached to the wet surface, the surface having the fine droplets attached thereto is again wet extended either by steaming or ultrasonic spraying.

3. A method for matting a pre-sensitized printing plate as claimed in claim 2, wherein the resin is selected from the group consisting of copolymers of acrylic acid esters and acrylic acid, terpolymers of styrene, acrylic acid esters, and acrylic acid, or copolymers of styrene, acrylic acid esters, acrylonitrile and acrylic acid.

4. A method for matting a pre-sensitized printing plate as claimed in claim 2, wherein the aqueous liquid is water.

5. A method for matting a pre-sensitized printing plate as claimed in claim 2, wherein the aqueous liquid is water further containing a low boiling organic solvent.

6. A method for matting a pre-sensitized printing plate as claimed in claim 2, wherein the resin is contained in the aqueous liquid in an amount of 5 to 30% by weight.

7. A method for matting a pre-sensitized printing plate as claimed in claim 1, wherein the matted surface has 1 to 1,000 protuberances per $mm^2$ on the surface thereof.

8. A method for matting a pre-sensitized printing plate as claimed in claim 7, wherein the matted surface has 5 to 500 protuberances per $mm^2$ on the surface thereof.

9. A method for matting a pre-sensitized printing plate material as claimed in claim 8, wherein the protuberances have a height of about 2 to 20 microns.

10. A method for matting a pre-sensitized printing plate as claimed in claim 9, wherein the protuberances have a height of about 0.5 to 20 microns.

11. A method for matting a pre-sensitized printing plate as claimed in claim 2, wherein the fine droplets of aqueous liquid are attached to the photographic light-sensitive material under a surrounding condition of a temperature of 15° to 60° C. and a relative humidity of 15 to 80%.

12. A method for matting a pre-sensitized printing plate as claimed in claim 11, wherein the surrounding conditions are a temperature of 20° to 45° C. and a relative humidity of 30 to 70%.

13. A method for matting a pre-sensitized printing plate as claimed in claim 1, wherein the aqueous liquid is water.

14. A method for matting a pre-sensitized printing plate as claimed in claim 1, wherein the aqueous liquid is water further containing a low boiling organic solvent.

15. A method for matting a pre-sensitized printing plate as claimed in claim 1, wherein the resin is contained in the aqueous liquid in an amount of 5 to 30% by weight.

16. A method for matting a pre-sensitized printing plate as claimed in claim 1, wherein the resin is selected from the group consisting of copolymers of acrylic acid esters and acrylic acid, terpolymers of styrene, acylic acid esters, and acrylic acid, or copolymers of styrene, acrylic acid esters, acrylonitrile and acrylic acid.

17. A method for matting a pre-sensitized printing plate as claimed in claim 1, wherein the fine droplets of aqueous liquid are attached to the photographic material under surrounding condition of a temperature of 15° to 60° C. and a relative humidity of 15 to 80%.

18. The method of claim 1, wherein due to said matting the fine droplets extend as the contact angle thereof with the pre-sensitized printing plate is decreased and wherein following drying the resulting resin solids which were dissolved or dispersed in the fine droplets firmly adhere to the surface of the pre-sensitized printing plate to yield protuberances in scattered form on the surface of the pre-sensitized printing plate.

19. The method of claim 2, wherein due to said matting the fine droplets extend as the contact angle thereof with the pre-sensitized printing plate is decreased and wherein following drying the resulting resin solids which were dissolved or dispersed in the fine droplets firmly adhere to the surface of the pre-sensitized printing plate to yield protuberances in scattered form on the surface of the pre-sensitized printing plate.

* * * * *